US009952247B2

(12) United States Patent
Sullivan et al.

(10) Patent No.: US 9,952,247 B2
(45) Date of Patent: Apr. 24, 2018

(54) GENERATING TIMING SIGNALS

(71) Applicant: OXFORD UNIVERSITY INNOVATION LIMITED, Botley, Oxford (GB)

(72) Inventors: Jonathan Shamus Sullivan, Fleet (GB); Kamaljit Singh Chana, Oxford (GB)

(73) Assignee: OXFORD UNIVERSITY INNOVATION LIMITED, Botley, Oxford (GB)

( * ) Notice: Subject to any disclaimer, the term of this patent is extended or adjusted under 35 U.S.C. 154(b) by 64 days.

(21) Appl. No.: 15/305,918

(22) PCT Filed: Apr. 21, 2015

(86) PCT No.: PCT/GB2015/051181
§ 371 (c)(1),
(2) Date: Oct. 21, 2016

(87) PCT Pub. No.: WO2015/162414
PCT Pub. Date: Oct. 29, 2015

(65) Prior Publication Data
US 2017/0045547 A1 Feb. 16, 2017

(30) Foreign Application Priority Data
Apr. 23, 2014 (GB) .................................. 1407147.6

(51) Int. Cl.
*G01P 3/481* (2006.01)
*G01P 3/488* (2006.01)
(Continued)

(52) U.S. Cl.
CPC .......... *G01P 3/481* (2013.01); *G01D 5/24476* (2013.01); *G01M 15/14* (2013.01);
(Continued)

(58) Field of Classification Search
CPC .......... G01P 3/489; G01P 3/481; G01P 3/488; G01P 3/4805; G01D 5/24476; H03K 5/01; H03K 5/082; G01M 15/14
See application file for complete search history.

(56) References Cited

U.S. PATENT DOCUMENTS

| 4,115,831 A | 9/1978 | Minakuchi |
| 5,015,878 A | 5/1991 | Lasagna et al. |
| (Continued) | | |

FOREIGN PATENT DOCUMENTS

| DE | 3234383 A1 | 3/1984 |
| EP | 2357444 A1 | 8/2011 |
| (Continued) | | |

*Primary Examiner* — Freddie Kirkland, III
(74) *Attorney, Agent, or Firm* — Harness, Dickey & Pierce, P.L.C.

(57) ABSTRACT

The invention relates generating timing signals registering the passage of a component past a sensor. The invention relates particularly to the generation of timing signals in real time for health monitoring of a mechanical system, for example for detecting excessive distortion or vibration of rotor blades in a turbine. In a disclosed arrangement, a method is provided in which a the sensor is configured to output a signal that is dependent on a separation between a component and the sensor, and the method comprises: performing a first passage event integral of an output from the sensor over at least a portion of a first passage event of a reference component past the sensor; performing a second passage event integral of an output from the sensor over at least a portion of a second passage event of a component to be measured past the sensor, the second passage event occurring after the first passage event; and generating a timing signal when the second passage event integral is equal to a predetermined fraction of the first passage event integral. By integrating the signal, short noise pulses will not cause timing errors. Optionally, only a part of the received (Continued)

signal will be integrated, e.g. portions of the signal which are above the average value of the signal in a preceding period of time.

23 Claims, 4 Drawing Sheets

(51) Int. Cl.
    *G01P 3/489*     (2006.01)
    *G01D 5/244*     (2006.01)
    *G01R 19/175*     (2006.01)
    *H03K 5/01*     (2006.01)
    *G01M 15/14*     (2006.01)
    *H03K 5/08*     (2006.01)

(52) U.S. Cl.
    CPC .............. *G01P 3/488* (2013.01); *G01P 3/489* (2013.01); *G01R 19/175* (2013.01); *H03K 5/01* (2013.01); *H03K 5/082* (2013.01)

(56) References Cited

U.S. PATENT DOCUMENTS

| | | | |
|---|---|---|---|
| 5,163,312 A | 11/1992 | Ayers | |
| 5,213,726 A | 5/1993 | Ramsey et al. | |
| 5,224,374 A | 7/1993 | Ayers | |
| 5,244,372 A | 9/1993 | Ramsey et al. | |
| 5,430,370 A | 7/1995 | Rooke | |
| 6,552,531 B1 | 4/2003 | Fey et al. | |
| 8,836,321 B2* | 9/2014 | Sasaki | G01P 3/489 |
| | | | 318/607 |
| 9,316,571 B2* | 4/2016 | Muller | G01N 3/20 |
| 9,404,385 B2* | 8/2016 | Rowe | F01D 17/04 |
| 9,506,401 B2* | 11/2016 | Bacic | F01D 21/003 |
| 2011/0298450 A1 | 12/2011 | Foletto et al. | |
| 2013/0020977 A1 | 1/2013 | Sasaki | |
| 2015/0211969 A1* | 7/2015 | Muller | F03D 17/00 |
| | | | 73/849 |

FOREIGN PATENT DOCUMENTS

| | | |
|---|---|---|
| EP | 2390471 A2 | 11/2011 |
| EP | 2402563 A2 | 1/2012 |
| GB | 1428887 A | 3/1976 |
| GB | 2024428 A | 1/1980 |
| GB | 2482468 A | 2/2012 |
| JP | H04-331305 A | 11/1992 |
| JP | 2002107133 A | 4/2002 |
| JP | 2008151261 A | 7/2008 |
| SU | 933380 A1 | 6/1982 |
| WO | WO-2009-004319 A2 | 1/2009 |

\* cited by examiner

GENERATING TIMING SIGNALS

CROSS-REFERENCE TO RELATED APPLICATIONS

This application is a 371 U.S. National Stage of International Application No. PCT/GB2015/051181, filed Apr. 21, 2015, which claims the benefit of and priority to British Patent Application No. GB 1407147.6, filed Apr. 23, 2014. The entire disclosures of the above applications are incorporated herein by reference.

The invention relates to generating timing signals registering the passage of a component past a sensor. The invention relates particularly to the generation of timing signals in real time for health monitoring of a mechanical system, for example for detecting excessive distortion or vibration of rotor blades in a turbine.

It is known to detect the passage of blades using a sensor. A timing signal may be generated based on the output of the sensor to register passage of each blade past the sensor. Ideally, each timing signal, which may consist of a pulse or "trigger", records a moment in time when a predetermined portion of the blade (e.g. the centre of a tip of the blade) passes the sensor. A plurality of timing signals may be output as a sequence of blades passes over the sensor. Variations in the relative arrival times of the blade at the sensor can be used to detect distortion or vibrations in the rotor and thereby detect malfunctions. If the detection can be done quickly (e.g. within one or a relative small number of rotations of the rotor) corrective action, such as an emergency shutdown or lowering of power, can be initiated.

It is advantageous to produce the triggers as quickly as possible, for example substantially at the instant when a required portion, for example 50% or the centre of the blade, has passed over a reference position of the sensor. However, this can be difficult to achieve accurately. Improvements in accuracy can be achieved by delaying the trigger by one or more rotations. The data is thus no longer produced strictly in real time but the additional accuracy may be important in the study/measurement of the blade behaviour.

The output pulse from the sensor will tend to vary in size and shape from blade to blade due to variations in blade geometry, for example variations in the length of the blades. If triggers are generated based on comparison with a fixed signal level, triggers for different blades will tend to be output at different relative positions of the blades relative to the sensor. This can lead to errors in measurements that are made based on the triggers.

In an attempt to counter this problem, it is known to apply a so-called MAX-MIN technique. In this technique, the peak and trough of a signal pulse are obtained and used to derive a midpoint signal level that is half way between the maximum (MAX) and minimum (MIN). A trigger for a following pulse is then generated when the signal passes through the derived midpoint. This approach provides a degree of auto-tuning of the trigger generation circuit to the geometry of the set of blades. However, the approach has drawbacks. These are described below with reference to FIG. 1, which shows a schematic output from the sensor as a function of time.

For a simplified discussion we will assume true infinity ($\infty$) is observed between each blade (i.e. the sensor output reaches a level consistent with an infinite separation between the sensor and any blade). In the example shown in FIG. 1, there are three blade pulses peaking at 3, 5 and 2 units of voltage V. The ($\infty$) is at −1V. Signal pulse P1 may therefore be considered to have a peak magnitude of 4 units.

Ideally, a timing signal (trigger) would be generated at position t1 (the turning point). Using the MAX-MIN technique the MIN is measured somewhere near to t0 and the MAX is measured somewhere near to t1. A circuit sets the trigger value L1 to $V\infty + \frac{1}{2} \times (V1 - V\infty) = 1$ unit.

Similarly for pulse P2, the MIN ($\infty$)=−1 and MAX=5, therefore the trigger level $L2 = V\infty + \frac{1}{2}(V2 - V\infty) = 2$ units. Applying the same approach for pulse P3 yields L3=0.5 units.

There is inherently a ½ pulse width delay in generating a trigger in this method. This is shown as $\Delta d1$ for pulse P1 as an example (derived from the time difference between V1 peak and L1 level). For perfectly stable signals (in a lab) the $\Delta dn$ value should be constant. However noise, which is naturally present, can cause "jitter" in the $\Delta dn$ value and therefore jitter in the timing of the timing signals (triggers) generated. This is explained below with reference to FIG. 2.

FIG. 2 shows a schematic output from a sensor of the type shown in FIG. 1 but at a larger scale. Error bars have been added to show representative errors in the MIN, MAX and L1 values due to random noise (not shown) superimposed on the primary signal.

In this case the MIN is measured at t0 with an error band EB1, here about ±0.5 units. The MAX is measured at t1 with an error band EB2, here about ±0.5 units. Taking extreme values of the error bars we can see that L1 might be expected to vary on average between about 1.5 (−0.5+0.5×(3.5+0.5)) and 0.5 (−1.5+0.5×(2.5+1.5)), which is a variation of 1.0 (significantly larger than the 0.5 units of noise superimposed on the signal).

In addition to this error is the noise of the signal, in this case about ±0.5 units. The trigger may be expected to occur on average within a relatively wide range from about 2.0 (1.5+0.5) to about 0.0 (0.5 0.5), which tends to yield relatively large error bars EB3 for the L1 level. In this simple example the error in triggering point can be 2.0 units, being 4 times the noise amplitude per half wave or a total of 2 times the peak to peak noise.

The timing error will depend upon the mean noise frequency. As the noise frequency tends to $\infty$ the error will tend towards zero. In the context of turbines, practice indicates that the noise frequency is relatively close to the carrier and other random sources but is close enough to the primary signal frequency to develop 1st order errors. A further source of error which will not be described in detail is the effect of non-uniform noise when using sample and hold peak detectors. In addition to the error function described a random spike will be measured at its peak or trough value and a random spike will also affect level triggering.

It would be desirable to reduce the time difference $\Delta d$ between passage of a central portion of the blade and the trigger point. It would also be desirable to reduce $\Delta d$, the jitter in the value of $\Delta d$, in order that improved precision and/or repeatability can be achieved. It would also be desirable to provide a timing signal that is able to tolerate significant variations in the distance of closest approach between blades and the sensor.

It is an object of the invention to at least partially address one or more of the problems with the prior art discussed above.

According to an aspect of the invention, there is provided an apparatus for generating a timing signal for registering a passage of a component past a sensor, comprising: the sensor, wherein the sensor is configured to output a signal that is dependent on a separation between a component and the sensor; and a timing signal generation device, wherein the timing signal generation device is configured to: perform a first passage event integral, defined as an integral of an output from the sensor over at least a portion of a first passage event of a reference component past the sensor; perform a second passage event integral, defined as an integral of an output from the sensor over at least a portion of a second passage event of a component to be measured past the sensor, the second passage event occurring after the first passage event; and generate a timing signal when the second passage event integral is equal to a predetermined fraction of the first passage event integral.

The timing signal may comprise a short pulse marking passage of a particular region (e.g. a central region) of a component past the sensor. Passage of a plurality of components leads to a corresponding sequence of short pulses. Each of the timing signals or short pulses may be referred to as "trigger".

The use of integration removes (or at least greatly reduces) random or pseudo-random noise and therefore provides a more accurate timing signal. A more accurate timing signal makes it possible to compare timings between different passage events of the same component or different components reliably. When measuring vibration modes in turbines, for example, the higher modes have a smaller blade deflection requiring a higher resolution of timing precision to resolve as the blade aerofoil movement gets smaller, typically below 100 microns, which is difficult to resolve using conventional triggering. Detection of fault conditions may therefore be more reliable and/or sensitive. Integration can be performed effectively, and in real time, using simple analogue circuits, minimizing a delay between passage of a component and generation of a corresponding timing signal. Rapid response to fault conditions is therefore possible at reasonable cost. Complex, high power electronics or processing capacity to implement at high speed complex procedures such as curve fitting (an alternative approach for smoothing away noise in a pulse output from the sensor) are not required. Generating a timing signal based on the integrated signal provides a truer measure of a reference point of the passage event, e.g. a central point of the passage event, than prior art approaches based on minima and maxima in the sensor output because the accuracy of the timing signal is less influenced by component distortions. The accuracy and reliability of the approach is less sensitive to variations in the distance of closest approach between the components and the sensor than prior art approaches.

Referring to the prior art approach of FIG. 2 for example, the prior art will establish more or less the same MIN value and the same MAX value for an early blade, computing the mid point EB3,L1 for a trigger point. The only way an earlier trigger will occur is if the negative slope after EB2,t1 is sharper which is not the case, it is shallower. The leading positive slope is sharper. With an integral method the whole integral of the curve (the body of the curve), even from EB1, to, will be shifted left thus producing an earlier trigger which is desirable. In the prior art MAX-MIN method the levels do not change much, which results in less sensitivity to early/late blades.

This approach is much less vulnerable to erratic signal spikes than prior art level based triggering methods. The improvement is achieved because the power of the spike (approx delta V×delta t) is small compared to the integral, whereas the spike delta V alone is large compared to the prior art level based trigger point voltages. A spike for example has a large value but short duration so it has a significant effect on level but only a small effect on the integral.

In an embodiment, the reference component and the component to be measured are different components and the reference component is positioned so as to be the component that passes the sensor directly before the component to be measured. In a cyclic system comprising a plurality of components to be measured (for example a plurality of blade tips on a rotor), using an immediately preceding component (e.g. blade tip) as the reference reduces sensitivity of the timing signal generation to variations in the cycle speed (e.g. rotation speed for a rotor). Differences between the sensor signal pulses from different components (e.g. different pulse heights or shapes) may affect the timing signals generated for each pulse but such differences will be expected to be the same from one cycle to the next and will not therefore affect the accuracy of measurements that compare the timing signals generated from one cycle to the next (which are useful for detecting fault conditions for example). Furthermore, using an immediately preceding component as the reference allows the fastest possible "real time" response because it is not necessary to wait for a whole cycle (e.g. turbine rotation) between measurement of the reference component and component to be measured.

In an embodiment, the reference component and the component to be measured are the same component (for example the same blade where the components to be measured comprise a plurality of blade tips on a rotor). In this case, the first and second passage event integrals may be obtained in different cycles. An advantage of this approach is that the sensor signal pulses will tend to vary less between different passage events of the same component as compared to the variation seen between passage events of different components. On the other hand, the delay between the first and second passage event integrals (at least one cycle) reduces the speed of the "real time" response and the approach may also be more sensitive to variations in the cycle speed (e.g rotor speed), which can change more over the duration of a cycle than during the time interval between passage of two adjacent components past the sensor.

In an embodiment, the timing signal is generated in "real time" (i.e. rapidly, for example within one cycle or within a small number of cycles). This is facilitated by the particular method (using the first and second passage event integrals) used to generate the timing signal. For example, simple and efficient analogue circuitry can be used to determine the integrals rapidly.

In an embodiment the first passage event integral is performed over a portion of the first passage event in which the output from the sensor is above a reference value. This approach helps to ensure that the beginning and end points of the first integration can be identified with high accuracy and reliability, using simple, e.g. analogue, components. Similarly, the second passage event integral may be performed over a portion of the second passage event starting from when the output from the sensor first exceeds the reference value in the second passage event. This helps to ensure that the beginning of the second integration is identified with high accuracy and reliability, using simple, e.g. analogue, components. In an embodiment, the reference value is determined based on an average value of the output over a preceding period of time. The average value of the output can be obtained efficiently and reliably using analogue components (e.g. a low pass filter).

According to an aspect, there is provided an apparatus comprising: a component configured to be moved cyclically past a sensor; and an apparatus for generating a timing signal for registering passage of the component past the sensor according to an embodiment of the invention.

According to an aspect, there is provided a device for detecting a fault condition in an apparatus comprising a cyclically moving component, the device comprising: an apparatus for generating a timing signal according to an embodiment; and a fault condition determination device configured to analyse time delays between timing signals obtained at different times in order to detect a fault condition.

According to an aspect, there is provided a device for detecting a fault condition in a turbine, comprising: an apparatus for generating a timing signal according to an embodiment, wherein the component to be measured is the tip of a rotor blade and timing signals are generated for a plurality of the rotor blades; and a fault condition determination device configured to analyse the timing signals in order to detect when deformation of the rotor blades or vibration of the rotor blades exceeds a predetermined threshold.

According to an aspect, there is provided a method of generating a timing signal for registering passage of a component past a sensor, wherein: the sensor is configured to output a signal that is dependent on a separation between a component and the sensor, and the method comprises: performing a first passage event integral, defined as an integral of an output from the sensor over at least a portion of a first passage event of a reference component past the sensor; performing a second passage event integral, defined as an integral of an output from the sensor over at least a portion of a second passage event of a component to be measured past the sensor, the second passage event occurring after the first passage event; and generating a timing signal when the second passage event integral is equal to a predetermined fraction of the first passage event integral.

Embodiments of the invention will now be described, by way of example only, with reference to the accompanying drawings in which corresponding reference symbols indicate corresponding parts, and in which.

Figure 1:
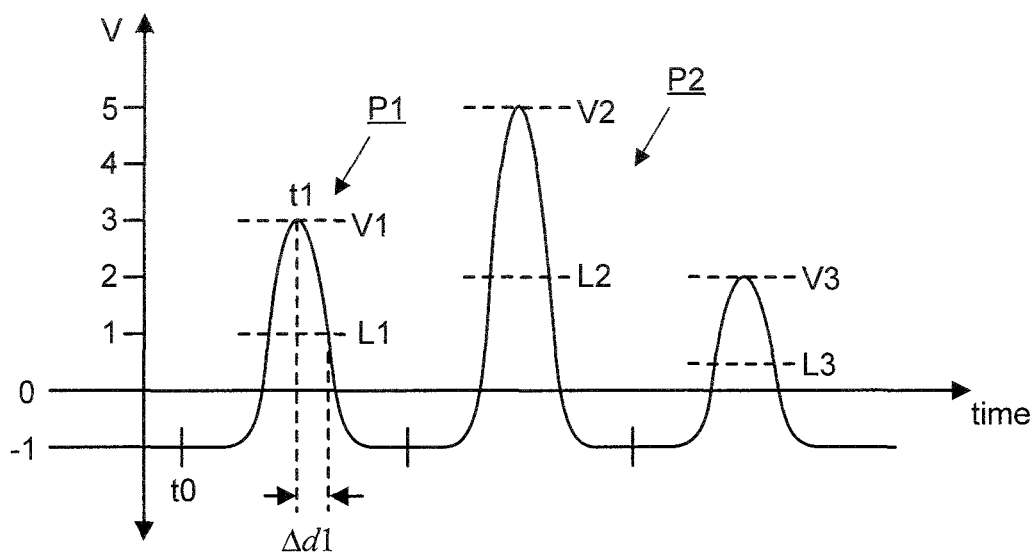
FIG. 1 depicts a schematic output from a sensor for detecting passage of a component.
Figure 2:
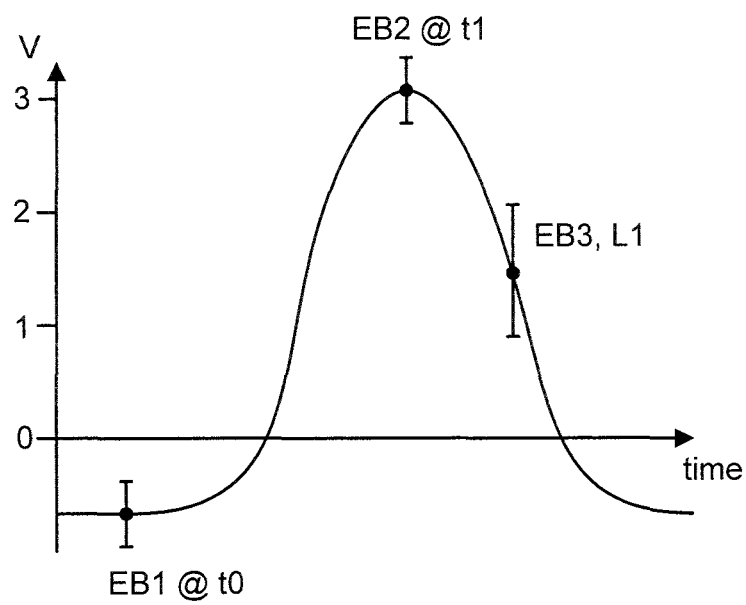
FIG. 2 depicts a schematic output of the type shown in FIG. 1 at a larger scale, illustrating representative error bars due to noise.
Figure 3:
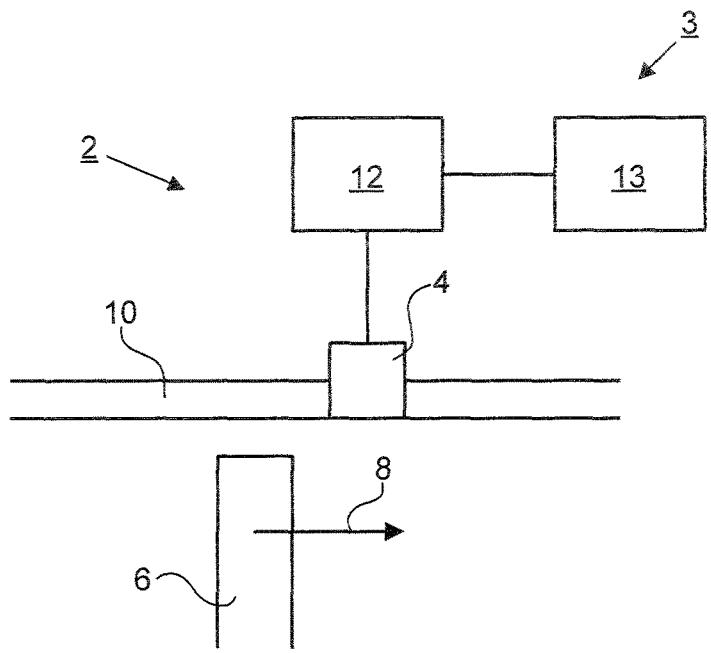
FIG. 3 depicts a device for detecting a fault condition in an apparatus comprising a cyclically moving component.

In an embodiment, there is provided an apparatus for generating a timing signal for registering passage of a component past a sensor. An example of such an apparatus 2 is shown FIG. 3.

The apparatus 2 comprises a sensor 4. The sensor 4 is configured to output a signal that is dependent on a separation between a component 6 and the sensor 4. The sensor 4 may be an eddy current sensor for example. In the example shown the sensor 4 is mounted to a housing 10 relative to which the component 6 is configured to move (arrow 8). The component 6 may comprise the tip of a turbine blade and the housing 10 may comprise a turbine housing that radially surrounds the tips of the turbine blades. The movement 8 of the component 6 may arise due to rotation of the turbine within the housing 10.

Figure 4:
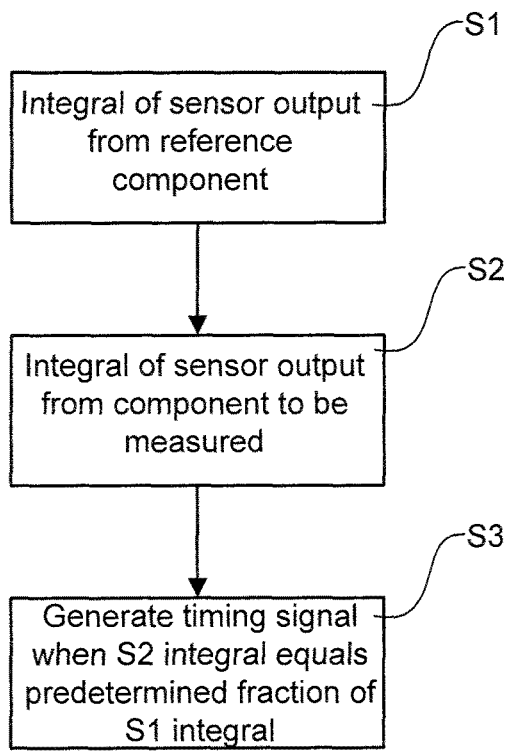
FIG. 4 depicts a method of generating a timing signal for registered passage of a component past a sensor.

The output from the sensor 4 is directed to a timing signal generation device 12. The timing signal generation device 12 is configured to perform the steps illustrated in FIG. 4, as follows.

In step S1, the timing signal generation device 12 performs a first passage event integral of an output from the sensor 4 over at least a portion of a first passage event of a reference component past the sensor 4.

In step S2, the timing signal generation device 12 performs a second passage event integral of an output from the sensor 4 over at least a portion of a second passage event of a component to be measured past the sensor 4. The second passage event occurs after the first passage event.

In step S3, the timing signal generation device 12 generates a timing signal when the second passage event integral is equal to a predetermined fraction of the first passage event integral.

Analogue circuitry may be used to determine the first and/or second passage event integrals efficiently and reliably. The integral can be obtained for example by converting the signal to be integrated to a current and monitoring the build of charge on a capacitor. According to signal theory, and reasonably in practice, the integral of random noise is zero, so the integration process greatly reduces the effect of noise on the accuracy of the generated timing signal.

In an embodiment the apparatus 2 is used as part of a device 3 for detecting a fault condition in an apparatus comprising a cyclically moving component 6. In such an embodiment, a fault condition determination device 13 may be provided that analyses time delays between timing signals obtained at different times from the timing signal generation device 12 in order to detect a fault condition.

In an embodiment the device 3 for detecting a fault condition is configured to detect a fault condition in a turbine, with the component 6 to be measured being the tip of a rotor blade and the timing signals being generated for a plurality of the rotor blades. In such an embodiment, the fault condition determination device 13 may be configured to analyse the timing signals in order to detect when deformation of the rotor blades or vibration of the rotor blades exceeds a predetermined threshold.

In an embodiment the reference component and the component to be measured are configured to move cyclically. The components may be mounted on a rotatable structure and may pass the sensor 4 at least once during each rotation of the rotatable structure. A plurality of the components may be provided at different circumferential positions on the rotatable structure (e.g. blades of a turbine). Alternatively or additionally, the components may be configured to reciprocate linearly or along any other trajectory.

In an embodiment, the reference component and the component to be measured are the same component (e.g. the same blade tip). Alternatively, the reference component and the component to be measured may be different components. For example, the reference component may be positioned so as to be the component that passes the sensor 4 directly before the component to be measured (e.g. the reference component and the component to be measured may be circumferentially neighbouring blade tips). Using a different component as the reference component may introduce a time shift to the timing signal due to a difference in shape or relative position of the reference component relative to the component to be measured. For example, a difference in the size of a peak in the sensor output associated with passage of the different components may vary and may cause a shift in the timing signal. However, this time shift will be the same from one cycle to the next cycle and does not therefore have a negative effect on the usefulness of the timing signals for detecting fault conditions, which will generally be detected by compared timing signals corresponding to particular components from one cycle to another cycle. Furthermore, gains in accuracy may be obtained because the shorter time interval between measurement of the reference component and measurement of the component to be measured reduces the sensitivity to variations in the overall speed of movement of the components (e.g. the speed of rotation of the rotor in the context of measurement of turbine blades).

Figure 5:
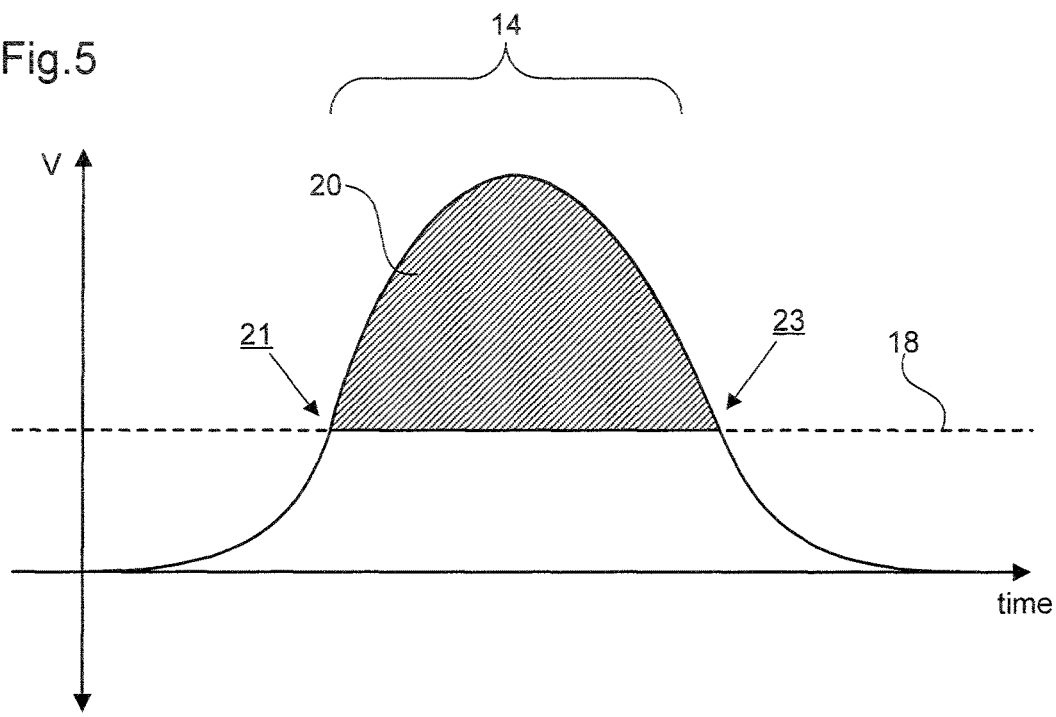
FIG. 5 depicts an output from the sensor for one passage event of a reference component, illustrating calculation of a first passage event integral.
Figure 6:
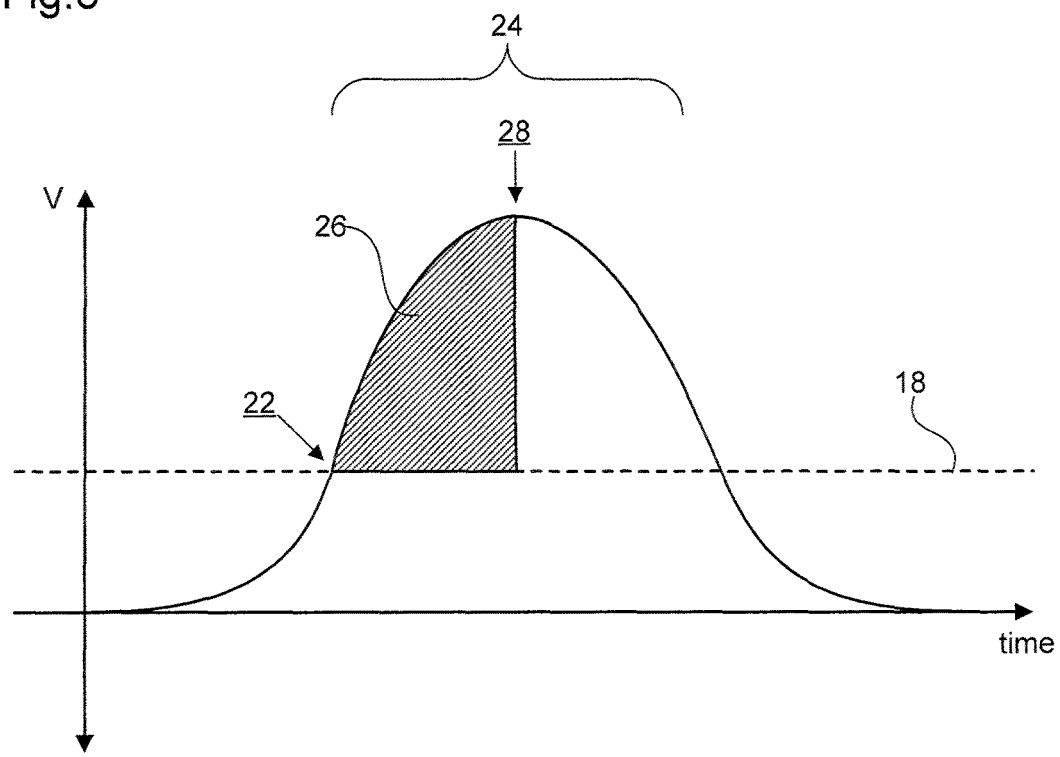
FIG. 6 depicts an output from the sensor for a subsequent passage event of the same or a different component, illustrating calculation of a second passage event integral and identification of a trigger point.

FIGS. 5 and 6 show a schematic output from the sensor 4 illustrating an embodiment. FIG. 5 illustrates the sensor output for a first passage event 14 of a component 6 past the sensor 4. FIG. 6 illustrates the sensor output for a second passage event 24 of a component 6 past the sensor 4.

In this embodiment, the first passage event integral is performed over a portion of the first passage event 14 in which the output from the sensor 4 is above a reference value (broken line 18). Thus, the value of the first passage event integral is the hatched area 20 under the curve, above the broken line 18, and delimited by cross-over points 21 and 23.

In this embodiment, the second passage event integral is performed over a portion of a second passage event 24 starting from a point 22 at which the output from the sensor 4 first exceeds the reference value in the second passage event 24. The timing signal generation device 12 generates a timing signal when the second passage event integral reaches a predetermined fraction of the first passage event integral. In the embodiment shown in FIG. 6 the predetermined fraction is equal to 0.5 so the integration stops when the area 26 reaches half the area 20 shown in FIG. 5, leading to generation of a timing signal at a position 28 that is near to or at the central point of the curve corresponding to the second passage event.

In an embodiment the reference value is determined based on (e.g. equal to) an average value of the output over a preceding period of time. The average value may be obtained using analogue circuitry, for example by means of a low-pass filter or long-term integrator (provided that a zero mean exists). The preceding period of time may correspond to a single movement cycle (e.g. a period of rotation) of the component, multiple cycles, or another period of time.

In an embodiment, the apparatus 2 for generating a timing signal is configured to output timing signals substantially in real time. For example, in an embodiment the component 6 is configured to move cyclically and the timing signal registering passage of the component 6 past the sensor 4 may be output by the timing signal generation device 12 before the same component 6 passes the sensor 4 again during a subsequent cycle. Alternatively or additionally, the timing signal registering passage of the component 6 past the sensor 4 may be output by the timing signal generation device 12 before the same component 6 passes the sensor 4 two times, 5 times or more.

Figure 7:
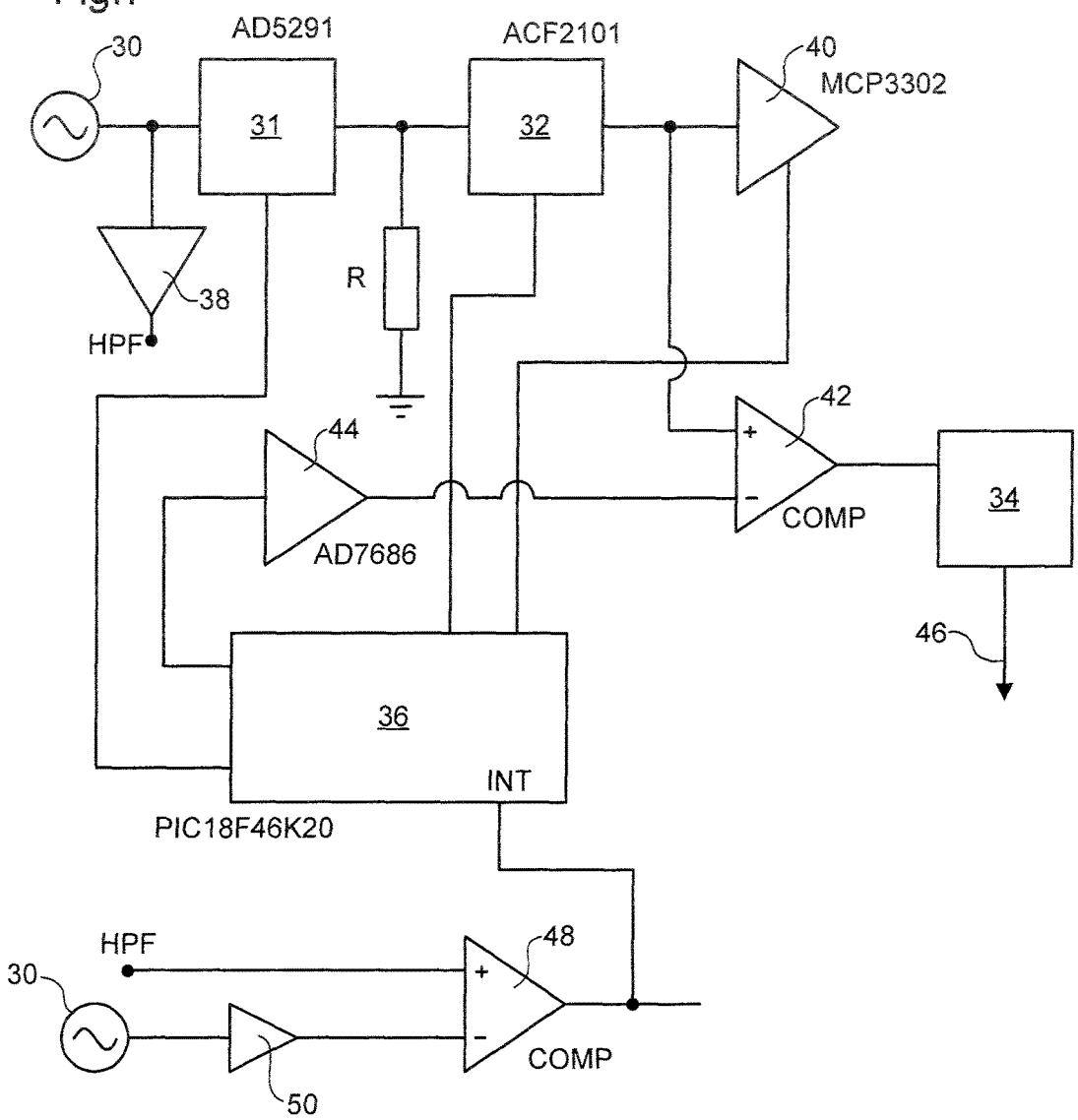
FIG. 7 depicts an example circuit for implementing the timing signal generation device.

FIG. 7 depicts in detail an example circuit for implementing the timing signal generation device. Example component numbers are provided for selected components. According to this embodiment a demodulated signal from the sensor 4 is fed into the circuit via a coupling 30. The signal is fed through a programmable attenuator 31. The output from the attenuator 31 is fed to an integrator 32. The attenuator 31 ensures that an integration performed by the integrator 32 stays within the dynamic range of the device. Slow moving pulses (produced for example by a slowly rotating rotor) will have a larger "time" integration than faster moving (and therefore shorter) pulses. The integrator 32 is a high performance low noise analogue integrator whose output is the integration of the input current, scaled by the attenuator 31. The attenuator may be replaced by a synchronous gating circuit taking precisely the same number of samples over a fixed time regardless of rotor speed. The end effect provides the same control.

A width of a portion of the pulse that is to be integrated (corresponding to the time width of the first passage event integral mentioned above) is computed by a comparator 48. The comparator 48 produces a gate signal to mark the beginning and end of the first passage event integral integration for each pulse from the sensor 4. The comparator 48 compares an output from a high pass filter 38 with an output from a low pass filter 50. The low pass filter 50 calculates an average value of the output from the sensor 4 (corresponding to broken line 18 in FIGS. 5 and 6). Comparing the average value of the output from the sensor 4 with a high pass filtered version of the output makes it possible to identify the crossing points 21 and 23 shown in FIG. 5, which represent the beginning and end of the integration for calculating the first passage event integral.

The gate signal is fed into a fast interrupt port on a microprocessor 36. A background interrupt routine will compute the width of the first passage event integral for each pulse, allowing the integrator 32 to compute the relevant area under the current curve. The total area (first passage event integral) is computed for every pulse, every rotation. The output of the integrator 32 is a voltage from 0 to 10 v. The attenuator 31 ensures the integration will always stay within that range. A one cycle history (comprising values of the first passage event integrals for every component being cycled, e.g. every blade on the rotor) is stored as a number by the microprocessor 36.

The integrator 32 voltage is measured by a fast 16 bit (65, 536 levels) Analogue to Digital converter 40. The resolution of each level of the ADC is 150 µV. From a historic (e.g. one cycle or rotation old) measurement of the first passage event integral, a midway (half, for example) value of the first passage event integral is calculated by the microprocessor 36. For example if the first passage event integral value was measured as 6V during the historic measurement a target integration value of 3V is calculated. This voltage is generated by a fast 16 bit Digital to Analogue converter 44 during the time a new pulse integration value is being measured (a "second passage event integral", corresponding to the area 26 under the curve in FIG. 6 for example). The historic 3V midway value is compared in real time by comparator 42 to the actual present integrated value. When the present integrated value (second passage event integral) reaches half the historic integrated value (first passage event integral) the comparator 42 "fires". This generates a non-retriggerable trigger pulse through the pulse generator 34, thereby forming an output timing signal 46. The process is repeated for each successive component 6 (e.g. blade tip). The processor 36 will need to compute a long integer calculation for each component passage event. In this embodiment, the processor 36 stores one calculation for each passage event, each rotation. The calculation is used once and then it is replaced. The output timing signal 46 from the circuit will comprise a timing trigger pulse for each passage event (e.g. each passage of a blade tip). The leading edge of the trigger pulse will correspond precisely to the top centre of each pulse in the output from the sensor 4 (e.g. point 28 in FIG. 6).

The integration is a "continuous" analogue function and so rises smoothly. The timing quantization error comes from how accurately the "mid power" voltage level can be set by DAC 44. In an experiment performed by the inventors, an integration performed using sampled data shows the integration to have a slope of 11 mV over 50 samples, sampled at 220 ns (4.5 MHz) by an oscilloscope. 50 samples=(50× 220 ns). Therefore a 16 bit DAC with a precision of 150 μV yields a theoretical time precision of 11 μS/73=150 ns (11 mV/150 μV=73). Other factors may reduce the ability to achieve this fully, but this simple theoretical case illustrates the high potential of the methodology.

Figure 8:
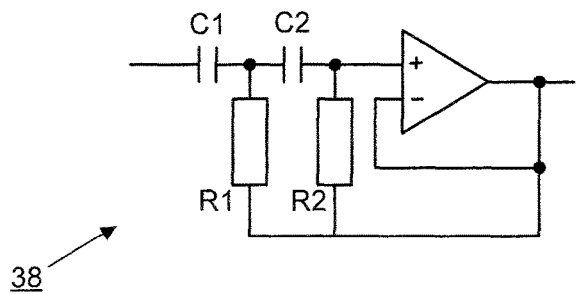
FIG. 8 depicts an example implementation of the high pass filter in the circuit of FIG. 7.

FIG. 8 depicts an example circuit for implementing the high pass filter 38. In an embodiment, the resistance values R1 and R2 are 75 kΩ and 150 kΩ respectively, and the capacitance values C1 and C2 are both 15 nF.

The above discussion has focused on embodiments in which the component to be measured is a turbine blade. However, this is not essential. The approach may be applied to generate timing signals for many other types of component. For example, the approach could be applied to any rotating component, for example gear teeth on a gear wheel. The approach may be used on phonic wheels for speed and/or torque measurements.

The invention claimed is:

1. An apparatus for generating a timing signal for registering a passage of a component past a sensor, comprising:
the sensor, wherein the sensor is configured to output a signal that is dependent on a separation between a component and the sensor; and
a timing signal generation device, wherein the timing signal generation device is configured to:
perform a first passage event integral, defined as an integral of an output from the sensor over at least a portion of a first passage event of a reference component past the sensor;
perform a second passage event integral, defined as an integral of an output from the sensor over at least a portion of a second passage event of a component to be measured past the sensor, the second passage event occurring after the first passage event; and
generate a timing signal when the second passage event integral is equal to a predetermined fraction of the first passage event integral.

2. An apparatus according to claim 1, wherein the reference component and the component to be measured are configured to move cyclically.

3. An apparatus according to claim 2, wherein the reference component and the component to be measured are the same component.

4. An apparatus according to claim 2, wherein the reference component and the component to be measured are different components.

5. An apparatus according to claim 4, wherein the reference component is positioned so as to be the component that passes the sensor directly before the component to be measured.

6. An apparatus according to claim 1, wherein the component to be measured is mounted on a rotatable structure and passes the sensor at least once during each rotation of the rotatable structure.

7. An apparatus according to claim 6, wherein a plurality of components of the same type as the component to be measured are mounted at different circumferential positions on the rotatable structure.

8. An apparatus according to claim 7, wherein the components comprise at least a portion of a rotor blade of a turbine.

9. An apparatus according to claim 1, wherein the timing signal generation device comprises analogue circuitry configured to perform the first and second passage event integrals.

10. An apparatus according to claim 1, wherein the first passage event integral is performed over a portion of the first passage event in which the output from the sensor is above a reference value.

11. An apparatus according to claim 10, wherein the second passage event integral is performed over a portion of the second passage event starting from when the output from the sensor first exceeds the reference value in the second passage event.

12. An apparatus according to claim 10, wherein the reference value is determined based on an average value of the output over a preceding period of time.

13. An apparatus according to claim 12, wherein the reference value is equal to the average value.

14. An apparatus according to claim 12, wherein the timing signal generation device comprises analogue circuitry configured to obtain the average value.

15. An apparatus according to claim 14, wherein the analogue circuitry comprises a low-pass filter.

16. An apparatus according to claim 1, wherein the predetermined fraction is equal to 0.5.

17. An apparatus comprising:
a component configured to be moved cyclically past a sensor; and
an apparatus for generating a timing signal for registering passage of the component past the sensor according to claim 1.

18. A device for detecting a fault condition in an apparatus comprising a cyclically moving component, the device comprising:
an apparatus for generating a timing signal according to claim 1; and
a fault condition determination device configured to analyse time delays between timing signals obtained at different times in order to detect a fault condition.

19. A device according to claim 18, wherein the apparatus for generating a timing signal is configured to output timing signals substantially in real time.

20. A device for detecting a fault condition in a turbine, comprising:
an apparatus for generating a timing signal according to claim 1, wherein the component to be measured is the tip of a rotor blade and timing signals are generated for a plurality of the rotor blades; and
a fault condition determination device configured to analyse the timing signals in order to detect when deformation of the rotor blades or vibration of the rotor blades exceeds a predetermined threshold.

21. A method of generating a timing signal for registering a passage of a component past a sensor, wherein:
the sensor is configured to output a signal that is dependent on a separation between a component and the sensor, and the method comprises:

performing a first passage event integral, defined as an integral of an output from the sensor over at least a portion of a first passage event of a reference component past the sensor;

performing a second passage event integral, defined as an integral of an output from the sensor over at least a portion of a second passage event of a component to be measured past the sensor, the second passage event occurring after the first passage event; and generating a timing signal when the second passage event integral is equal to a predetermined fraction of the first passage event integral.

22. A method of detecting a fault condition in an apparatus comprising a cyclically moving component, comprising:

generating a plurality of timing signals according to the method of claim 21;

analysing time delays between the plurality of timing signals in order to detect a fault condition.

23. A method of detecting a fault condition in a turbine, comprising:

generating timing signals using the method of claim 21, wherein the components to be measured are the tips of rotor blades and timing signals are generated for a plurality of the rotor blades;

analysing the timing signals in order to detect when deformation of the rotor blades or vibration of the rotor blades exceeds a predetermined threshold.

* * * * *